US006315641B1

(12) United States Patent
Lee et al.

(10) Patent No.: US 6,315,641 B1
(45) Date of Patent: Nov. 13, 2001

(54) METHOD AND APPARATUS FOR CHEMICAL MECHANICAL POLISHING

(75) Inventors: Kyu Hong Lee, Taejon; Yong Byouk Lee, Seoul; Sang Won Kang, Taejon, all of (KR)

(73) Assignees: Semicontect Corp; Genitech Co., Ltd., both of (KR)

( * ) Notice: Subject to any disclaimer, the term of this patent is extended or adjusted under 35 U.S.C. 154(b) by 0 days.

(21) Appl. No.: 09/509,334

(22) PCT Filed: Jul. 31, 1999

(86) PCT No.: PCT/KR99/00419

§ 371 Date: Mar. 24, 2000

§ 102(e) Date: Mar. 24, 2000

(87) PCT Pub. No.: WO00/07230

PCT Pub. Date: Feb. 10, 2000

(30) Foreign Application Priority Data

Jul. 31, 1998 (KR) .................................................. 98/30981
Jul. 28, 1999 (KR) .................................................. 99/30803

(51) Int. Cl.[7] ..................................................... B24B 7/19
(52) U.S. Cl. .............................. 451/41; 451/63; 451/270; 451/163; 451/170
(58) Field of Search ................................. 451/41, 59, 63, 451/159, 270, 271, 272, 274, 291, 163, 170; 438/691, 692

(56) References Cited

U.S. PATENT DOCUMENTS

| | | | |
|---|---|---|---|
| 5,177,980 | 1/1993 | Tuttle | 51/283 R |
| 5,232,875 | 8/1993 | Tuttle et al. | 437/225 |
| 5,308,438 | * 5/1994 | Cote et al. | 451/41 |
| 5,554,064 | 9/1996 | Breivogel et al. | 451/41 |
| 5,639,388 | * 6/1997 | Kimura et al. | 451/41 |
| 5,643,044 | 7/1997 | Lund | 451/5 |
| 5,899,800 | * 5/1999 | Shendon | 451/271 |
| 6,030,278 | * 2/2000 | Honda | 451/271 |

* cited by examiner

*Primary Examiner*—Eileen P. Morgan
(74) *Attorney, Agent, or Firm*—Marger Johnson & McCollom P. C.

(57) ABSTRACT

Method and apparatus for chemically mechanically polishing semiconductor substrates with enhanced durability, reliability and polishing effectiveness. In the method of the present invention, the substrate and the pad respectively orbits to guarantee uniform polishing across the substrate in principle. The apparatus of the present invention employing the above method is mechanically stable to enhance process reliability.

18 Claims, 10 Drawing Sheets

METHOD AND APPARATUS FOR CHEMICAL MECHANICAL POLISHING

TECHNICAL FIELD

The present invention relates generally to method and apparatus for fabricating semiconductor devices, more particularly to method and apparatus for chemically mechanically polishing semiconductor substrates with enhanced durability, reliability and polishing effectiveness.

BACKGROUND ART

As the overall dimensions of semiconductor devices continue to shrink, the demand is ever increasing for forming more metal interconnection layers on a semiconductor substrate. The metal interconnection layers or inter-layers for insulating the metal interconnection layers should be planarized to secure a focus margin for a following photolithography process. In most conventional fabrication processes the insulating inter-layers have been planarized using a BPSG (borophsophosilicate glass) reflow technique. In the BPSG reflow technique, a deposited BPSG layer is planarized by flowing the BPSG layer while heating the substrate to 800.degree. C. or more. However, the temperature of the reflow process is too high to be applicable to aluminum interconnection layers. In addition, the reflow technique is inadequate for the planarization of sub-micron fine patterns or the global planarization of a substrate.

Instead of the reflow technique, a resist etchback technique is known in the art of surface planarization. The resist etchback technique however has several drawbacks such as the increase in the thickness of insulating inter-layers, the necessity of additional processes and the difficulty of controlling etch ratio of insulating inter-layers and resist layers.

Therefore, recently chemical mechanical polishing (CMP) has been developed for providing planarized topographies. CMP is a process for improving the surface planarity of a semiconductor substrate and involves the use of a polishing pad with a slurry. Generally, the slurry contains a mechanical polishing agent, such as alumina or silica. Additionally, the slurry contains de-ionized water and selected chemicals which etch various surfaces of the substrate during processing. The chemicals include pH controlling solution, such as KOH or NaOH. The mechanical polishing and chemical polishing are simultaneously performed during overall polishing process.

in the CMP process the polishing rate is proportional to the parameters such as the pressure of the polishing pad on the substrate, and the relative velocity between the substrate and the polishing pad. In case of rotational motion, the perimeter of the substrate tends to rotate at higher velocity than the center of the substrate. Therefore in the CMP process used for semiconductor device fabrication, the relative velocity between the substrate and the polishing pad is maintained to be equal by combining two rotational movements with same rotational velocities.

FIG. 1 is a partial sectional view of a CMP apparatus in which the conventional CMP process is employed. Referring to FIG. 1, a platen drive motor 130 rotates a polishing pad 110 attached to a platen 120. A substrate 140 retained in a substrate carrier 150 is rotated against the pad 110 by a carrier drive motor 160. When the substrate 140 and the pad 110 rotate with a slurry supplied to the interface of the substrate 140 and the pad 110, the substrate 110 is chemically and mechanically polished.

The relative motion between a substrate and a polishing pad is shown in FIG. 2 when they respectively rotate. At an arbitrary point P on the substrate, the moving velocity $\overline{V}_{p1\ pad}$ of the substrate relative to the polishing pad can be represented by equation 1, that is, a difference between substrate moving velocity $\overline{V}_{PH}$ and pad moving velocity $\overline{V}_{PP}$.

$$\overline{V}_{p1\ pad} = \overline{V}_{PH} - \overline{V}_{PP} \qquad \text{(equation 1)}$$

Since the velocities $\overline{V}_{PH}$ and $\overline{V}_{PP}$ are equal to the vector products of the respective angular velocities and radius vectors, equation 1 can be expressed as following equation 2.

$$\overline{V}_{p1\ pad} = \overline{V}_{PH} - \overline{V}_{PP} = \overline{\omega}_H \times \overline{r}_H - \overline{\omega}_P \times \overline{r}_P = \overline{\omega}_H \times \overline{r}_H - \overline{\omega}_P \times$$
$$(\overline{r}_{cc} + \overline{r}_H) = (\overline{\omega}_H - \overline{\omega}_P) \times \overline{r}_H - \overline{\omega}_P \times \overline{r}_{cc} \qquad \text{(equation 2)}$$

where $\overline{\omega}_H$ is the rotational angular velocity of the substrate, $\overline{\omega}_P$ is the rotational angular velocity of the polishing pad, $\overline{r}_H$ is the position vector from the substrate rotation center to the point P, $\overline{r}_P$ is the position vector from the polishing pad rotation center to the point P, and $\overline{r}_{cc}$ is the position vector from the polishing pad rotation center to the substrate rotation center.

If the rotation angular velocities of the substrate and the polishing pad are equal ($\overline{\omega}_H = \overline{\omega}_P$), the equation 2 reduces to equation 3.

$$\overline{V}_{p1\ pad} = -\overline{\omega}_P \times \overline{r}_{cc} \qquad \text{(equation 3)}$$

From the equation 3, it will be appreciated that the relative moving speed between the substrate and the polishing pad depends upon the rotational angular velocity and the distance between two rotation centers, but not the position or direction on the substrate.

Accordingly, if the respective drive motors of the platen and the carrier are controlled such that the rotational angular velocities of the substrate and the polishing pad may be equal, the substrate can be uniformly polished since the relative moving speed between the substrate and the polishing pad is equal at all points on the substrate.

The movement of the equation 3 is equivalent to that a substrate orbits with a radius of $r_{cc}$ against a stationary polishing pad without rotation, as shown in FIG. 3A to FIG. 3C. From the viewpoint of relative motion, it is also equivalent to that a polishing pad orbits with a radius of $r_{cc}$ against a stationary substrate without rotation. FIG. 3A shows sequentially the states that the substrate and the polishing pad are rotated by 0, 45, 90, 180 and 270 degrees, respectively. Black dots are inserted in the figure to indicate the absolute positions of the substrates and the polishing pad. In case of fixing the position of the polishing pad, FIG. 3A can be expressed by FIG. 3B. As shown in FIG. 3C, all points of the substrate trace a circular path with a radius of $r_{cc}$ on the polishing pad.

If a point of a substrate traces a line path on a polishing pad, any trivial non-uniformity on the polishing pad can exert a harmful effect upon the substrate. Therefore, the area which a point of a substrate traces should be widened. For this reason, it is desirable that a substrate carrier or a platen is reciprocated within a predetermined range with a relatively low speed, as a sub motion. Hereinafter, the movement which induces chemical-mechanical polishing effect will be referred to as "main motioned", whereas the movement, making little contribution to the polishing, for obtaining other effects will be referred as "sub motion". In prior art CMP method, the rotational motions of the substrate and the polishing pad are examples of the main motion.

FIG. 4A shows sequentially the states that the substrate and the polishing pad are rotated by 0, 45, 90, 180 and 270 degrees, respectively, in case of combining uniform-velocity rotational motions of the substrate and the polishing pad with their low speed reciprocating motions, as sub motions.

Short lines are inserted in the figure instead of black dots of FIG. 3A to indicate the absolute positions of the substrates and the polishing pad, which represents that the tracing area is widened in the direction of reciprocating motion. In case of fixing the position of the polishing pad, FIG. 4A can be expressed by FIG. 4B. The area which an arbitrary point of a substrate traces is widened as shown in FIG. 4C. In addition, all points of the substrate trace the same area and the tracing paths are uniformly spread in all directions of the polishing pad. In this case, it is desirable that the ratio of the period of rotation movement to that of reciprocating movement is not a simple integer. If the ratio is a simple integer, the points of the substrate trace a closed curve path within the donut shape of FIG. 4C. Most ideally, if the ratio is not an integer but an irrational number, their tracing paths will completely cover the inside of the donut shape.

However, in a prior art CMP method, which respectively employs uniform-velocity rotational motions of the substrate and the polishing pad as main motion and their low speed reciprocating motions as sub motion, additional drive means for the sub motion is required instead of two drive motors for the rotations of the substrate and the polishing pad, resulting in complex mechanical configuration. Moreover, the rotation speeds of the two drive motors should be controlled to be within extremely small error range in order to maintain polishing uniformity at all points of the substrate.

U.S. Pat. No. 5,554.064 discloses a CMP method that combines a non-rotational orbiting of a polishing pad (,main motion) with a low speed rotation of a substrate (sub motion). In addition. U.S. Pat. No. 5,582,534 discloses methods and apparatus for CMP that combines a rotation of a polishing pad (main motion) with an orbiting of a substrate (sub motion). However, in the above methods, those areas of the substrate which are located further from the rotation center experience greater cumulative movement, and therefore greater material removal, than areas of the substrate maintained closer to the rotation center.

DISCLOSURE OF INVENTION

Accordingly, it is an object of the present invention to provide CMP method and apparatus that can guarantee uniform polishing across the substrate in principle in spite of using fewer number of drive means compared with the prior art.

If the orbital movement of a substrate or a polishing pad is employed as main motion, polishing process can be performed with only one drive means while maintaining the relative moving velocity between the substrate and pad equal for all points on the substrate. In this case, a second orbital movement is used as a sub motion for preventing trivial non-uniformity on the pad from exerting a harmful effect upon the substrate. In the above polishing process, the relative moving velocity between the substrate and pad for all points of the substrate is equal at any moments since all points of the substrate and pad move with same direction and velocity at any moments.

BEST MODE FOR CARRYING OUT THE INVENTION

Figure 1:
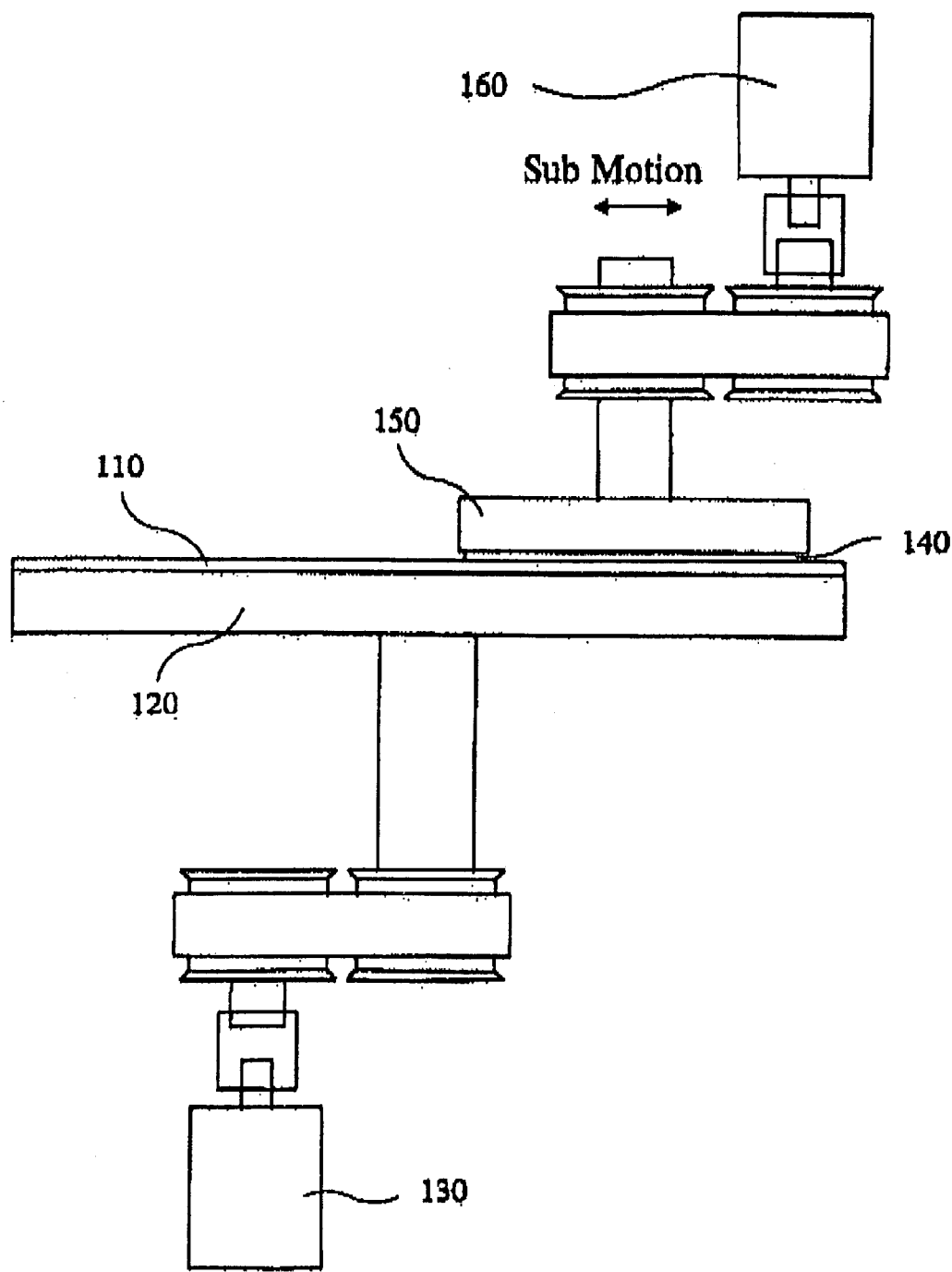
FIG. 1 is a partial sectional view of a CMP apparatus in which the conventional CMP process is employed, FIG. 2 conceptually depicts the basic conditions for uniform polishing in the prior art CMP method.
Figure 2:
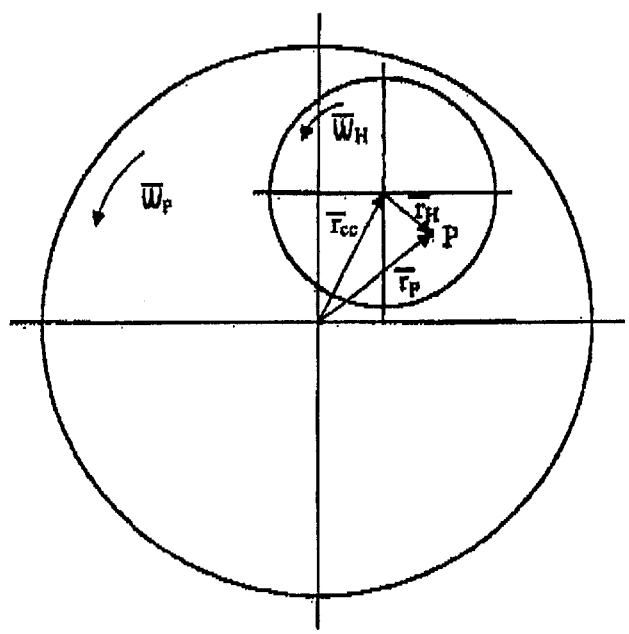
Figure 3A:
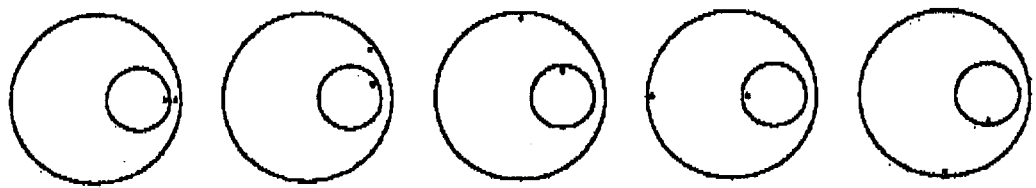
FIG. 3A to 3C are schematic views showing a prior art CMP method where the rotation velocities of the substrate and pad are equal.
Figure 3B:
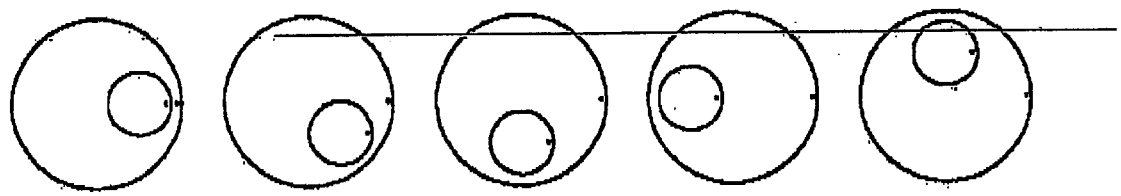
Figure 3C:
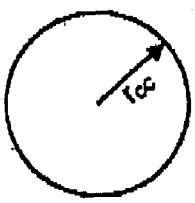
Figure 4A:
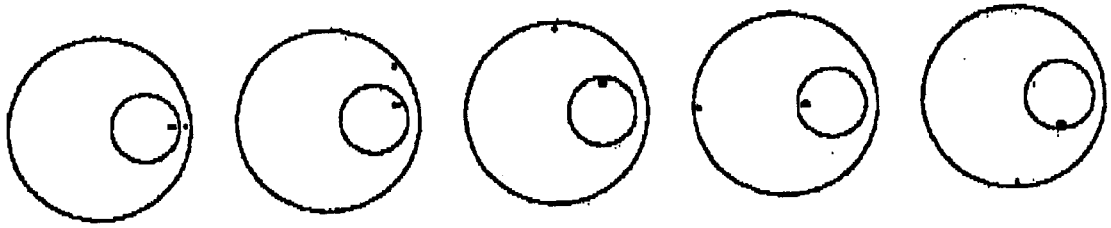
FIG. 4A to 4C are schematic views showing a prior art CMP method where the relatively low speed reciprocating movement is employed as a sub motion.
Figure 4B:
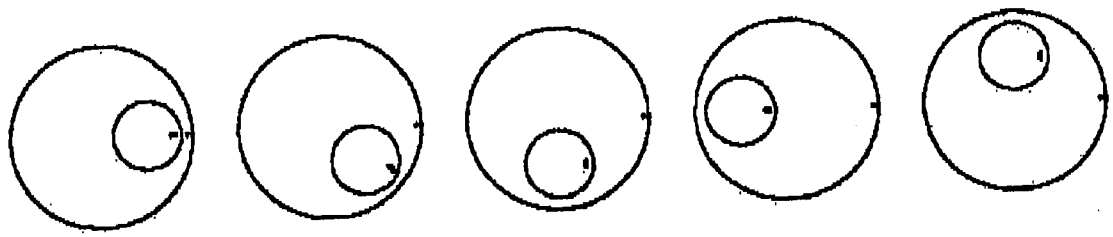
Figure 4C:
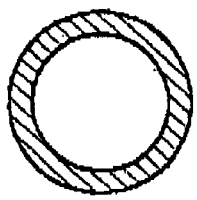
Figure 5A:
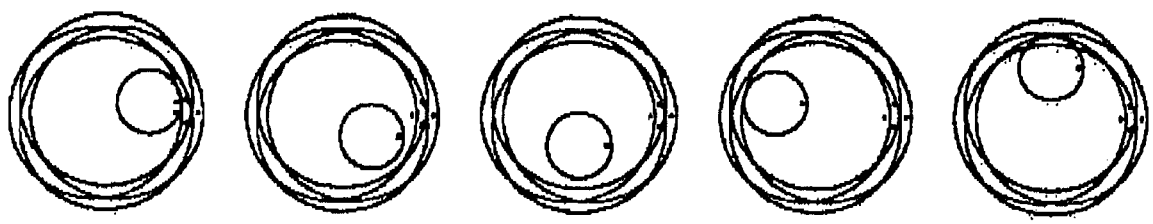
FIG. 5A to 5C are schematic views showing the CMP method of the present invention.
Figure 5B:
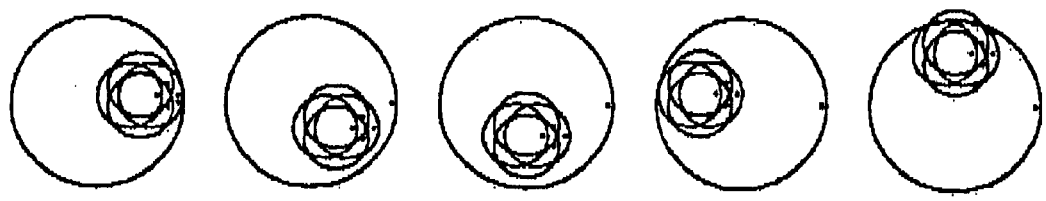
Figure 5C:
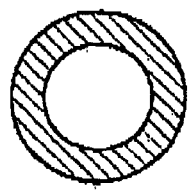

In case that the substrate and pad respectively orbit and the orbit radius of the pad is smaller than that of the substrate, the movements of the substrate and pad are shown in FIG. 5A. FIG. 5B shows the movement of the substrate relative to the stationary pad. The area which an arbitrary point of a substrate traces is shown in FIG. 5C. As is appreciated in figures, all points of the substrate trace the same area and the tracing paths are uniformly spread in all directions of the pad. It is desirable that the ratio of the periods of two orbital movements is not a simple integer. If the ratio is a simple integer, the points of the substrate trace a closed curve path within the donut shape of FIG. 5C. Most ideally, if the ratio is not an integer but an irrational number, their tracing paths will completely cover the inside of the donut shape.

If the orbit radii and angular velocities of the substrate and pad are equal, polishing does not occur since there is no relative motion between the substrate and pad. If the orbit radii are equal and only different angular velocities contribute to the polishing of the substrate, the area which a point of a substrate traces does not increase. Accordingly, it is desirable that the orbit radii of the substrate and pad differ from each other. If the orbit radii of the substrate and pad differ from each other, all points of the substrate cover same tracing area on the pad with the tracing path uniformly spread in all directions.

In case that the substrate and pad are respectively orbited in main and sub motions and vice versa, the relative movement between the substrate and pad is equivalent. Therefore, the CMP method of the present invention may employ any from the two mechanisms. If the carrier retaining a substrate weighs less than the platen, the former mechanism is mechanically more stable than the latter one. Hereinafter, to avoid repeated descriptions the present invention will be described with reference to only the former mechanism, the description however is not meant to be construed in a limiting sense. That is, the method of the present invention can be realized in accordance with the latter mechanism where the platen with a polishing pad fixed thereon moves in a main motion.

According to the prior art CMP method, all points of the substrate trace the same area and the tracing paths are uniformly spread in all directions only under the unrealistic conditions that at least three drive means should be used and the rotational velocities of the substrate and pad are completely equal. However, according to the method of the present invention, the same result can be obtained in principle with one or two drive means and without satisfying unrealistic limiting conditions.

According to the present invention, the substrate and pad can be orbited by only one drive means. In a mechanism where both the substrate carrier and platen can orbit, if the substrate is orbited by a drive means which transfers driving forces to the carrier, the frictional force between the substrate and pad provides orbital movement of the platen with the pad fixed thereon. If the platen is freely floating, polishing rate is insufficient since the relative velocity between the substrate and pad is too low. Accordingly, in a mechanism where the substrate carrier and platen are orbited by a drive means, it is desirable that the CMP apparatus of the present invention further comprises decelerating means for reducing the orbital velocity of the platen.

In case that the substrate and pad can be orbited by only one drive means, two orbiting directions are the same. However, in case that the substrate carrier and the platen are driven by separate driving means, they can orbit in opposite directions, which increases the relative velocity between the substrate and pad. Therefore, the maximum polishing rate can be doubled at an equal orbiting velocity, or minimum orbiting speed required for obtaining the same polishing rate can be reduced by half.

The CMP method of the present invention may utilize two slurry-feed mechanisms.

Figure 6A:
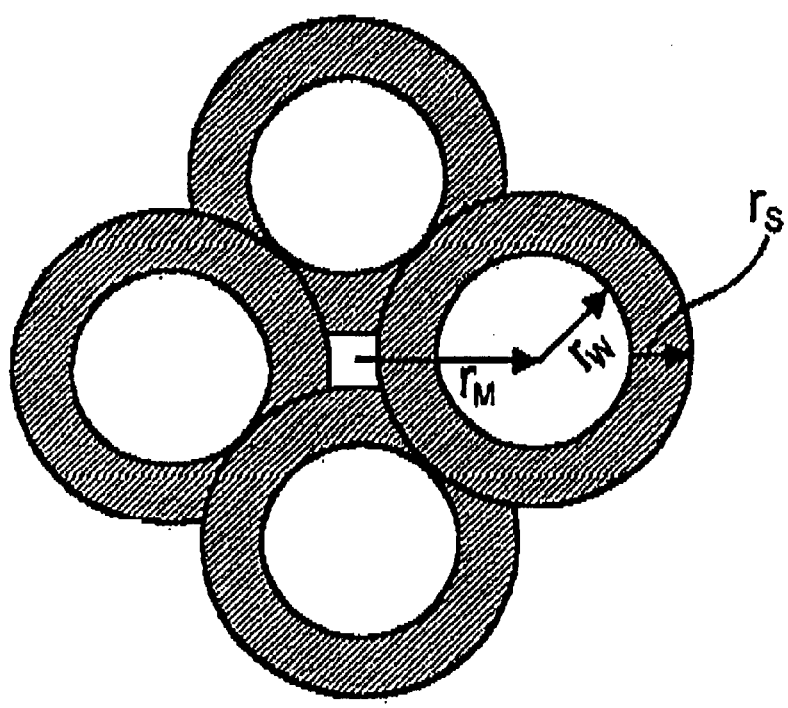
FIG. 6A and 6B are schematic views showing the effect of orbit radius exerted on the pad in the CMP method of the present invention.

In a first mechanism, the slurry can be supplied to a polishing pad through a slurry port which directly drips the slurry onto the polishing pad. The first mechanism is utilized when the orbit radii are sufficiently large compared to the size of the substrate, more particularly when the addition of main motion orbit radius $r_M$ and sub motion orbit radius $r_S$ is equal to or larger than the radius $r_W$ of the substrate. In this case, there is no point on the pad which is always covered by the substrate during polishing, as is shown in FIG. 6A. That is, any point on the pad can be exposed at least for a time interval during an orbit period of time. Accordingly, the entire pad can be conditioned during polishing. However, the first mechanism has a drawback that it requires a larger platen compared to that used in the following second mechanism.

Figure 6B:
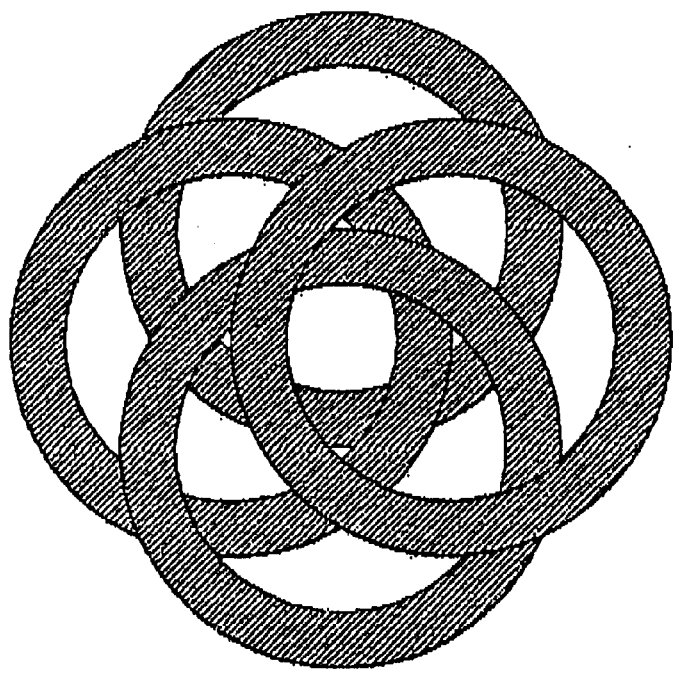

In a second mechanism, the slurry is supplied to the polishing pad after passing through the polishing pad. The second mechanism is utilized when the orbit radii are small compared to the size of the substrate, more particularly when the addition of main motion orbit radius and sub motion orbit radius is smaller than the radius of the substrate. By employing the second mechanism the size of the platen can be reduced. However, some portion of the pad can not be conditioned during polishing since the portion always contacts with the substrate as shown in FIG. 6B. Moreover, since the portion is always covered by the substrate during the period of orbital movement, the slurry can not be supplied to the portion by the method of dripping directly the slurry onto the pad. However, the problem involved in the second mechanism can be solved by supplying the slurry coming from the supply port of the platen to the contacting interface of the substrate and pad after passing through holes or slots of the polishing pad. The slurry feed lines connected to the platen does not twist since the orbiting platen does not rotate. In a second mechanism, the slurry is supplied to the polishing pad after passing through the polishing pad.

In most prior art CMP methods, the substrate is transferred with its polishing surface attached to the transfer member, but this method tends to damage the patterned front surface of the substrate, resulting in lowering the yield of the semiconductor devices. Therefore, it is more stable to employ the method of transferring the wafer with its backside attached to the transfer member. The procedure may be as following steps: (1) placing the substrate on the polishing pad while holding the backside of the substrate, (2) fixing the substrate with a substrate carrier, (3) polishing the front surface of the substrate. (4) releasing the substrate from the substrate carrier, and (5) lifting the polished substrate to transfer to another position. Especially, between steps (1) and (2), it is desirable that the substrate is fixed to the pad to prevent the substrate from moving. For this reason, the substrate may be fixed on the pad by a vacuum connected to the platen. The vacuum lines connected to the platen does not twist since the orbiting platen does not rotate.

The CMP apparatus according to the present invention can detect the frictional force between the substrate and pad by measuring a pressure at the shaft which supports the platen.

Figure 7:
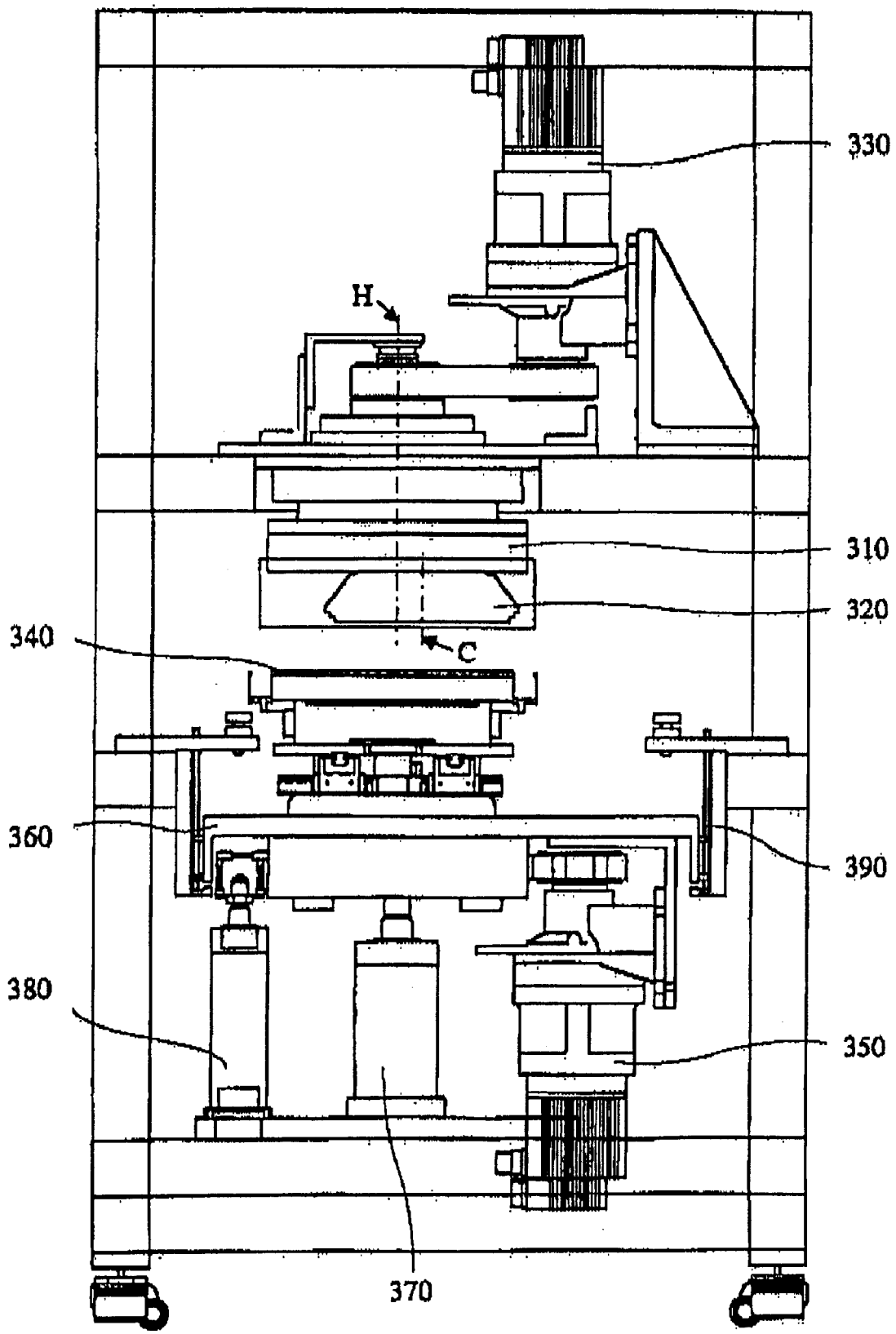
FIG. 7 is a cross sectional view of the CMP apparatus according to the embodiment of the present invention.

FIG. 7 is a cross sectional view of the CMP apparatus according to the embodiment of the present invention. Referring to FIG. 7, a head holder 310 can be rotated by a rotating motor 330. Below the head holder 310, a substrate carrier 320 orbiting about the rotation center H, spaced apart from the rotation center H of the head holder 310, is connected to the head holder 310 by bearings (not shown). A platen 340 with a polishing pad attached thereon is rotated by a platen drive motor 350. A platen base 360 is connected to a frame by a platen guide 390 to enable a predetermined range of reciprocating motion. An up/down drive cylinder is disposed at the central portion under the platen base 360 and a plurality of clamp cylinders 380, under the platen 340, is provided to adjust the position of the platen 340. A decelerating means for providing a friction between the substrate and pad may be added around the position of the platen drive motor 350.

Figure 8:
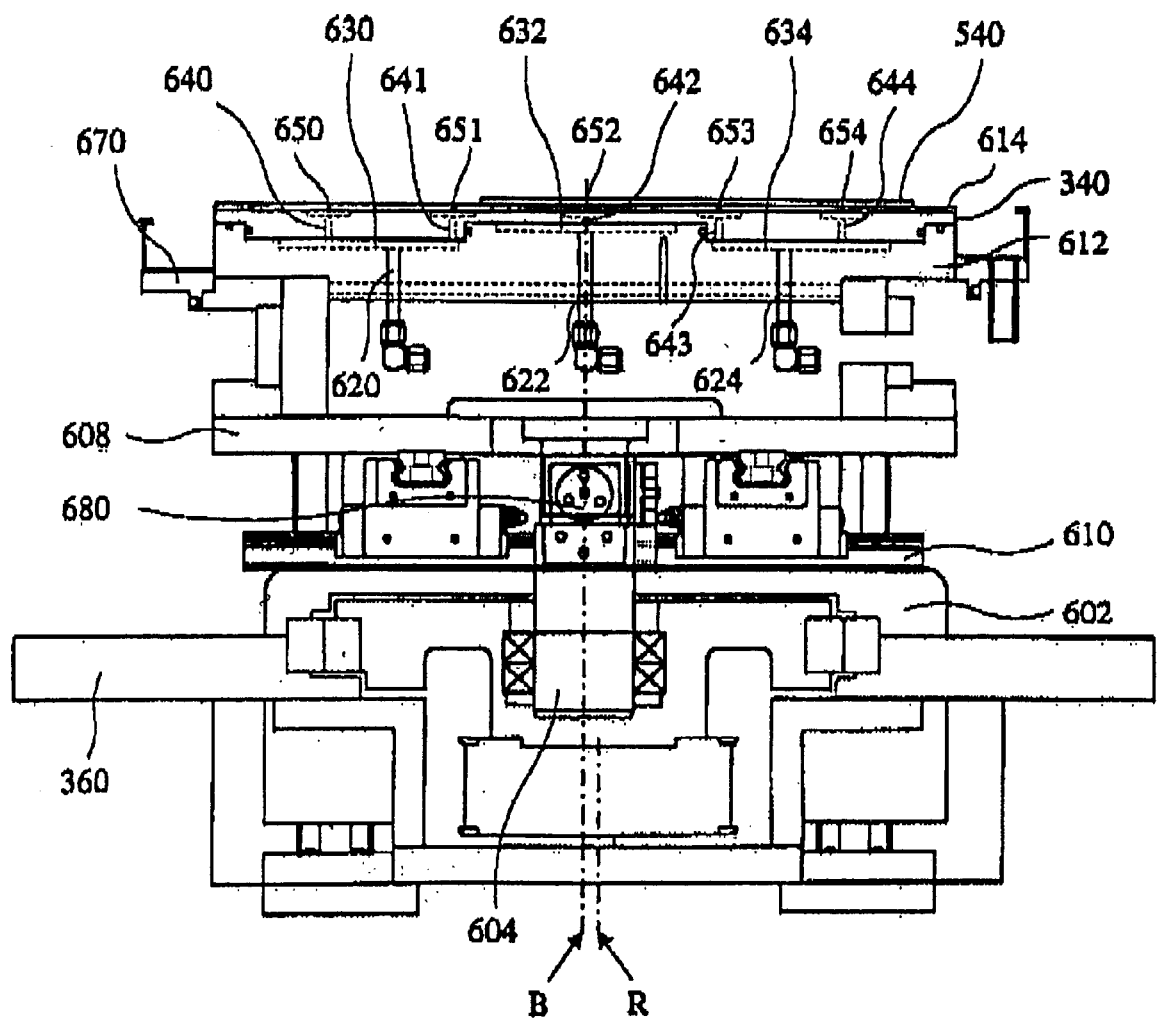
FIG. 8 is a cross sectional view illustrating the configuration of the platen of the CMP apparatus of the invention.

FIG. 8 is a cross sectional view illustrating the configuration of the platen of the CMP apparatus of the invention. Referring to FIG. 8, a rotating body 602 rotates about a center R by the platen drive motor. Rotating body bearings (not shown) are attached to the rotating body 602, where the central shaft B of the bearings is spaced apart from the rotating body R. A platen center shaft 604 is inserted in the rotating body bearings to enable the orbiting of the platen 340 with the rotation of the rotating body 602. A platen center shaft 604 is directly connected and fixed to a movable base 608, and the movable base 608 is fixed to an X-Y guide 610. Accordingly, the movable base 608 orbits together with the bearing center shaft B, but not rotates. Therefore, during the polishing a platen support 612, the platen 340 and the polishing pad 614 respectively move in a non-rotational orbital movement.

Figure 9A:
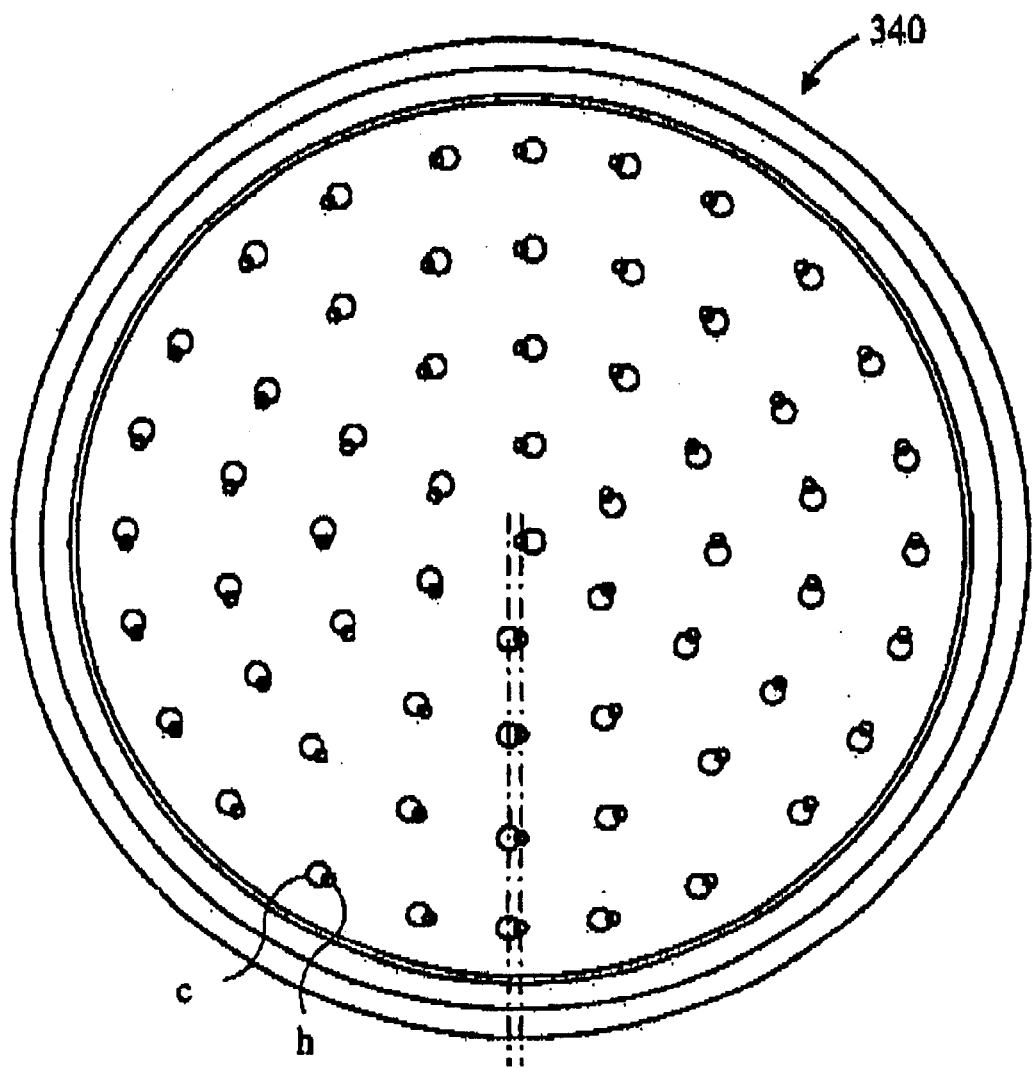
FIG. 9A and 9B show the structure of the platen.
Figure 9B:
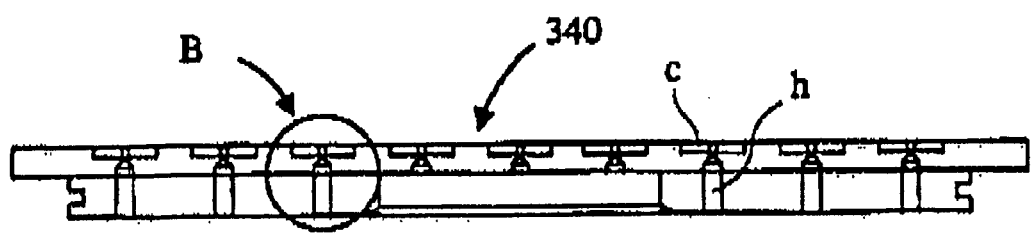

FIG. 9A and 9B show the structure of the platen. FIG. 9A is a plan view of the platen where the centers of both the slurry supply hole h and slurry channel c do not coincide with each other. FIG. 9B is a side sectional view of the platen. Referring to FIG. 9B, the slurry supply hole h is connected with the slurry channel c.

Figure 10A:
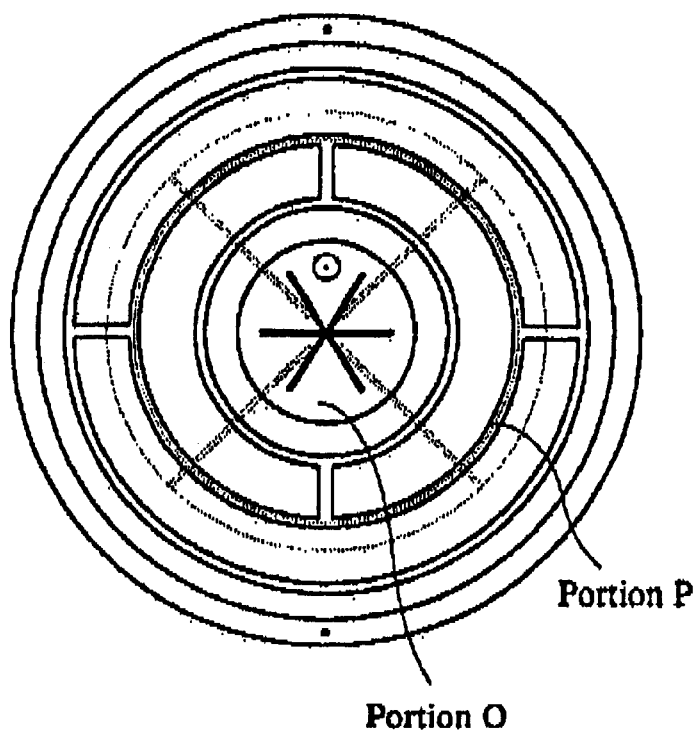
FIG. 10A and 10B show the structure of the platen support.
Figure 10B:
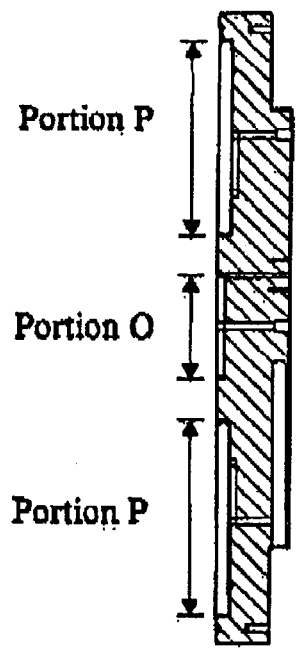

FIG. 10A and 10B show the structure of the platen support. FIG. 10A is a plan view of the platen support. Referring to FIG. 10A, the slurry supply areas are divided into two portions O and P. The O portion shows the central channel 632 of FIG. 8, and the P portions show the peripheral channels 630 and 634, respectively. FIG. 10B is a side sectional view of the platen support.

Figure 11:
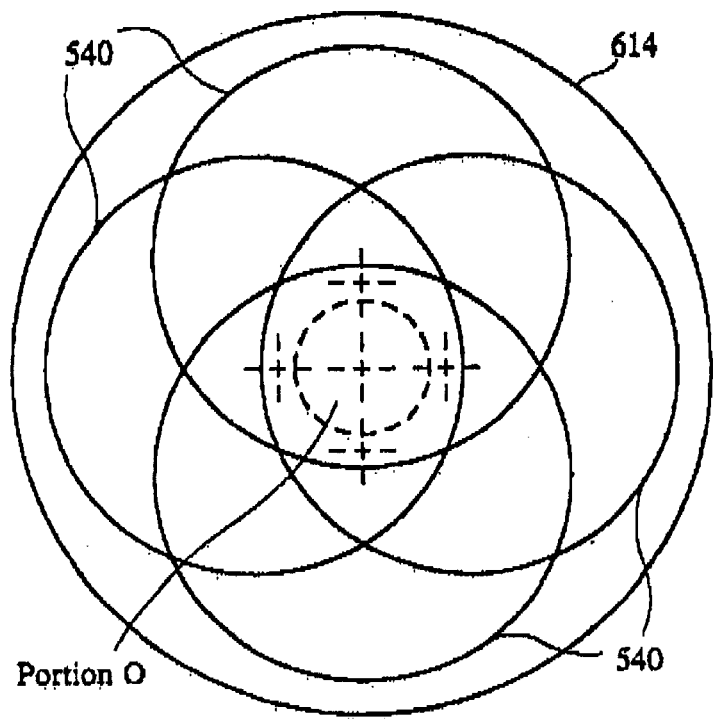
FIG. 11 illustrates vacuum loading mechanism of the substrate.

FIG. 11 illustrates vacuum loading mechanism of the substrate. In this embodiment where the substrate orbit radius is smaller than the pad orbit radius, the substrate 540 moves on the pad 614 as shown in the figure. Accordingly, there exists a portion always covered by a substrate during the polishing. If the O portion of FIG. 10A is located within the covered portion, the O portion will be located within the substrate when the substrate 540 is loaded on the pad 614. If the vaccum mechanism operates after the loading of the substrate, the substrate can be fixed on the pad even when the platen rises up.

Figure 12:
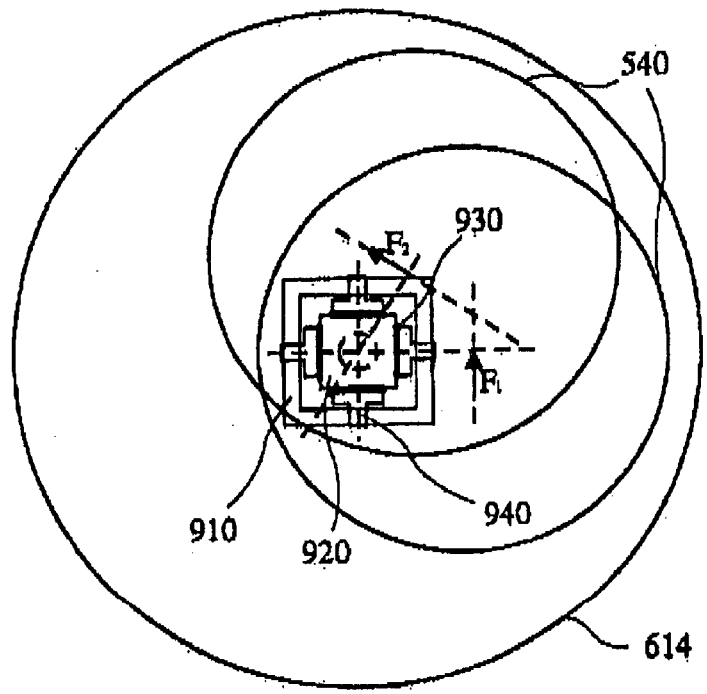
FIG. 12 shows an example of measuring the pressure, imposed by the frictional force between the substrate and pad, transferred to the shaft of an orbital movement.

FIG. 12 shows an example of measuring the pressure, imposed by the frictional force between the substrate and pad, transferred to the shaft of an orbital movement.

Referring to FIG. 12, the shaft for supporting the platen is divided in two parts: a lower shaft portion 910 and an upper shaft portion 920. The adjoining section of both shaft portions is a square, and there exists a spacing between both shaft portions for the respective faces of the square. Four pressure sensors 930 are disposed within the spacing, and pushing plates 940 is provided with the respective pressure sensors 930 to enhance the detection performance. The respective pushing plates 940 press the respective pressure sensors 930 against the upper shaft portion 920. When the substrate 540 orbits in a counter-clockwise direction during the polishing process, the frictional force between the substrate 540 and the pad 614 imposes forces, for example F1 or F2, on the platen in a tangential direction of the substrate orbit movement. The forces are transferred to the lower shaft portion 910 through the upper shaft portion 920. Then, the pressure sensors 930 detect the pressure due to the transferred forces and generate signals according to the pressure. Accordingly, the frictional forces changing as the polishing process proceeds can directly be detected and analyzed by an additional signal processing apparatus. This helps monitor the polishing procedure and helps determine polishing-stop timing.

According to the present invention, uniform polishing across the substrate is guaranteed in principle in spite of using fewer number of drive means compared with the prior art.

What is claimed is:

1. A method for chemically mechanically polishing a substrate with a polishing surface, comprising:
    placing the surface of said substrate and the surface of said polishing pad against one another;
    orbitally moving said polishing pad;
    orbitally moving said substrate; and
    preventing rotational movement of said substrate and said pad.

2. The method of claim 1, wherein radii of the orbital movement of said polishing pad and the orbital movement of said substrate are unequal.

3. The method of claim 1, wherein the sum of the radii of the orbital movement of said polishing pad and the orbital movement of said substrate is larger than the radius of the substrate.

4. The method of claim 1, wherein the sum of the radii of the orbital movement of said polishing pad and the orbital movement of said substrate is smaller than the radius of the substrate.

5. The method of claim 1, which further includes supplying a slurry for substrate polishing through an array of eccentrically arranged holes and channels formed in the platen and through said polishing pad during polishing of said substrate.

6. The method of claim 2, which further includes supplying a slurry for substrate polishing through an array of eccentrically arranged holes and channels formed in the platen and through said polishing pad during polishing of said substrate.

7. The method of claim 3, which further includes supplying a slurry for substrate polishing through an array of eccentrically arranged holes and channels formed in the platen and through said polishing pad during polishing of said substrate.

8. The method of claim 4, which further includes supplying a slurry for substrate polishing through an array of eccentrically arranged holes and channels formed in the platen through said polishing pad during polishing of said substrate.

9. The method of claim 1, further comprising temporarily holding said substrate against the surface of said polishing pad with a vacuum system formed in the platen.

10. The method of claim 1, further comprising determining polishing-stop timing by detecting pressure due to frictional forces between the pad and the substrate transferred to a shaft which supports the platen.

11. Chemical-mechanical polishing apparatus comprising:
    a polishing pad mounted on a platen;
    a substrate carrier for carrying a substrate; and
    means for orbitally moving said polishing pad and orbitally moving said substrate, while preventing rotational movement of both said substrate and polishing pad.

12. The chemical-mechanical polishing apparatus of claim 11, wherein said drive means comprises two drive motors for driving said polishing pad and said substrate, respectively.

13. The chemical-mechanical polishing apparatus of claim 11, further comprising means for decelerating by providing friction between said substrate and said polishing pad.

14. The chemical-mechanical polishing apparatus of claim 11, further comprising a slurry feed line connected to said platen so that the slurry is supplied through an array of eccentrically arranged holes and channels formed in the platen and through said polishing pad.

15. The chemical-mechanical polishing apparatus of claim 11, further comprising vacuum means formed in the platen to hold said substrate temporarily against the surface of said polishing pad via vacuum loading.

16. The chemical-mechanical polishing apparatus of claim 11, further comprising means for detecting pressure due to frictional forces transferred to a platen center shaft which supports the platen.

17. The chemical-mechanical polishing apparatus of claim 16, wherein said detecting means includes piezo-electric sensors.

18. The chemical-mechanical polishing apparatus of claim 11, wherein said drive means comprises a single motor driving one of said substrate and said polishing pad, and wherein movement is transmitted to the other of said substrate and said pad by friction between the two.

* * * * *

UNITED STATES PATENT AND TRADEMARK OFFICE
CERTIFICATE OF CORRECTION

PATENT NO.     : 6,315,641 B1
DATED          : November 12, 2001
INVENTOR(S)    : Kyu Hong Lee et al.

It is certified that error appears in the above-identified patent and that said Letters Patent is hereby corrected as shown below:

<u>Title page,</u>
Item [73], Assignee; "Semicontect Corp.; Genitech Co., Ltd." should read -- Genitech Co., Ltd., Semicontech Corp. --

<u>Column 1,</u>
Line 47, "in the CMP process" should read -- In the CMP process --;

<u>Column 3,</u>
Line 34, "orbiting of a polishing pad (, main" should read -- orbiting of a polishing pad (main --;
Line 67, "is employed," should read -- is employed; --;

<u>Column 4,</u>
Line 10, "of the present invention." should read -- of the present invention; --;
Line 19, "structure of the platen:" should read -- structure of the platen; --;

Signed and Sealed this

Tenth Day of September, 2002

Attest:

JAMES E. ROGAN
*Attesting Officer*   *Director of the United States Patent and Trademark Office*